(12) United States Patent
Hoelzlwimmer

(10) Patent No.: US 10,861,704 B2
(45) Date of Patent: Dec. 8, 2020

(54) METHOD FOR THE VAPOUR PHASE ETCHING OF A SEMICONDUCTOR WAFER FOR TRACE METAL ANALYSIS

(71) Applicant: SILTRONIC AG, Munich (DE)

(72) Inventor: Franz Hoelzlwimmer, Zeilarn (DE)

(73) Assignee: SILTRONIC AG, Munich (DE)

( * ) Notice: Subject to any disclaimer, the term of this patent is extended or adjusted under 35 U.S.C. 154(b) by 0 days.

(21) Appl. No.: 16/075,408

(22) PCT Filed: Mar. 23, 2017

(86) PCT No.: PCT/EP2017/057006
§ 371 (c)(1),
(2) Date: Aug. 3, 2018

(87) PCT Pub. No.: WO2017/174371
PCT Pub. Date: Oct. 12, 2017

(65) Prior Publication Data
US 2019/0051534 A1     Feb. 14, 2019

(30) Foreign Application Priority Data

Apr. 5, 2016   (EP) .................................... 16163874

(51) Int. Cl.
*H01L 21/306*     (2006.01)
*G01N 1/32*       (2006.01)
(Continued)

(52) U.S. Cl.
CPC ......... *H01L 21/30604* (2013.01); *G01N 1/32* (2013.01); *H01L 21/02019* (2013.01);
(Continued)

(58) Field of Classification Search
CPC ......... H01L 21/30604; H01L 21/02019; H01L 21/31116; H01L 21/67069;
(Continued)

(56) References Cited

U.S. PATENT DOCUMENTS 6,123,865 A    9/2000  Lin et al.
6,517,632 B2   2/2003  Minami et al.
(Continued)

FOREIGN PATENT DOCUMENTS

CN    104103561 A     10/2014
DE    198 50 838 A1   3/2000
(Continued)

OTHER PUBLICATIONS

Translation of Pang et al. (CN104103561) Oct. 2014 (Year: 2014).*
Tsunoda et al., JP2008130696A, 2008, translation. (Year: 2008).*
Bergman, WO2005016563A1, 2005, ab. (Year: 2005).*

*Primary Examiner* — Duy Vu N Deo
(74) *Attorney, Agent, or Firm* — Brooks Kushman P.C.

(57) ABSTRACT

The surface layer of a semiconductor wafer lying on a rotatable plate within an etching chamber is etched by a process whereby homogeneous etching of the surface is obtained by introducing an etching gas into the etching chamber in such a way that the flow of the etching gas is not directed directly to the wafer but is allowed first to distribute within the etching chamber before coming into contact with the surface of the semiconductor wafer to be etched.

7 Claims, 3 Drawing Sheets

(51) Int. Cl.
*H01L 21/02* (2006.01)
*H01L 21/311* (2006.01)
*H01L 21/67* (2006.01)
*C30B 29/06* (2006.01)

(52) U.S. Cl.
CPC .. H01L 21/31116 (2013.01); H01L 21/67069 (2013.01); *C30B 29/06* (2013.01)

(58) Field of Classification Search
CPC ........ H01L 21/32134; H01L 21/67063; G01N 1/32; C30B 29/06
See application file for complete search history.

(56) References Cited

U.S. PATENT DOCUMENTS

| | | | |
|---|---|---|---|
| 6,727,155 B1 * | 4/2004 | Yang | H01L 21/31116 257/E21.252 |
| 7,033,962 B2 | 4/2006 | Takeno | |
| 2003/0221611 A1 | 12/2003 | Kondo et al. | |
| 2009/0286333 A1 * | 11/2009 | Kozasa | H01L 21/31116 438/9 |

FOREIGN PATENT DOCUMENTS

| | | |
|---|---|---|
| EP | 0 750 336 A2 | 12/1996 |
| GB | 1334796 | 10/1973 |
| JP | 2001102368 A | 4/2001 |
| JP | 2003347229 A | 12/2003 |
| JP | 2008130696 A | 6/2008 |
| JP | 2011129831 A | 6/2011 |
| WO | 2011083719 A1 | 7/2011 |

* cited by examiner

METHOD FOR THE VAPOUR PHASE ETCHING OF A SEMICONDUCTOR WAFER FOR TRACE METAL ANALYSIS

CROSS REFERENCE TO RELATED APPLICATIONS

This application is the U.S. National Phase of PCT Appln. No. PCT/EP2017/057006 filed Mar. 23, 2017, which claims priority to European Application No. 16163874.7 filed Apr. 5, 2016, the disclosures of which are incorporated in their entirety by reference herein.

BACKGROUND OF THE INVENTION

1. Field of the Invention

The present invention relates to a method for the vapour phase etching of a semiconductor wafer in a process chamber in order to analyse metal impurities within the wafer surface layer. The invention relates, in particular, to a method for etching the surface layer of a semiconductor wafer with a mixture of etching and oxidizing gases, which allows etching the wafer surface in layers. The etched surface layers are not restricted to silicon oxide or nitride layers but are mono or poly crystalline silicon layers.

After etching the surface layer of the semiconductor wafer, the etched surface is treated with a scan solution which is subsequently analyzed for metal impurities of the wafer surface layer.

2. Description of the Related Art

Semiconductor wafers are slices of semiconductor materials such as, for example, element semiconductors (silicon, germanium), compound semiconductors (for example, aluminum, gallium or indium) or compounds thereof (for example, $Si_{1-x}Ge_x$, $0<x<1$; AlGaAs, AlGaInP etc.).

Electronics, microelectronics and microelectromechanics require as starting materials semiconductor wafers which have to meet extreme demands regarding global and local flatness, single-side-referenced flatness (nanotopology), roughness and cleanness.

In accordance with the prior art, semiconductor wafers are produced by means of a multiplicity of successive process steps which can generally be classified into the following groups:
(a) producing a usually monocrystalline semiconductor rod;
(b) slicing the rod into individual wafers;
(c) mechanical processing;
(d) chemical processing;
(e) chemomechanical processing;
(f) if appropriate additionally producing layer structures.

During each of these processing steps contamination of the semiconductor material with trace metal impurities may occur, as taught for example in DE 1 544 281 A1. Such metal impurities on a semiconductor wafer surface, in a surface layer of a semiconductor wafer, or a thin film such as an epitaxial silicon layer produced by CVD process on such a surface may affect adversely the electrical characteristics of semiconductor devices. Hence a highly sensitive and efficient analysis of such metallic impurities is necessary in order to measure the amount of trace metal impurities, e.g. for quality reasons.

In order to analyze such trace metal impurities the surface of the wafer must be etched in order to remove, for example, a defined crystalline silicon layer for a subsequent surface analyzing step, as described in the SEMI Draft Document 4844: New Standard: Guide for the Measurement of Trace Metal Contamination on Silicon Wafer Surface by Inductively Coupled Plasma Mass Spectrometry, Jan. 15, 2010. Respective etching methods may be divided into liquid phase etching (LPE), e.g. DE 198 50 838 A1 and gas phase etching (GPE) methods, e.g. EP 0 750 336 A2, the latter also referred to as vapor-phase decomposition method.

Japanese patent application JP 2011 129 831A disclose a method of analyzing ultra-trace metals on a silicon wafer surface layer with the gas phase etching method. According to JP 2011 129 831A an analysis method using a vapor-phase etching method is composed of a first step during which an etching gas (decomposition gas) is brought into contact with the surface of the silicon wafer, thereby etching (or decomposing) the silicon wafer to a desired thickness (amount), a second step of collecting the etched or decomposed substances of the surface layer and metallic impurities in the form of a solution for analysis by using a solvent such as water, and a third step of analyzing this solution for analysis.

JP 2011 129 831A teaches to use an HF gas containing ozone as the etching gas. By-products remain on the etched/decomposed surface layer and must be removed/inactivated by blowing an inert gas directly onto the wafer immediately after the by-products on the surface are generated. Furthermore, the by-products on the surface can be removed/inactivated by spraying water onto them.

After removal of the by-products, a subsequent hydrophobization with HF gas and an analysis step including a droplet scan and collection, decomposed substances collection treatment and metal analysis step can proceed according to the teaching of JP 2011 129 831A.

Unfortunately, the removal or inactivation of the by-products formed during the etching/decomposition step of the surface layer of the silicon wafer, results in a surface condition that does not allow a high collection efficiency of the metals in the etched layer. The resulting surface condition might consist of a very robust silicon oxide layer, which is not readily accessible for a scanning step. Hence, the collection efficiency is strongly impacted and the resulting metal content might reflect only a portion of the real content of the etched silicon layer.

WO 2011/083719 discloses a method for etching a surface layer of a silicon wafer using a mixture of hydrogen fluoride gas and nitrogen oxide gas, in order to analyze the metal contamination of the silicon wafers. The nitrogen oxide gas (nitrous gas) is generated by using the decomposition reaction of nitric acid ($HNO_3$) in the presence of a piece of silicon.

The method according to WO 2011/083719 has two main disadvantages, namely first the uncontrolled formation rate of the nitrous gas which does not allow a controlled etching process of the silicon wafer surface. Second, etching with nitrous gas results in undefined surface conditions due to the local formation of suboxides. These suboxides may disturb the subsequent metal analysis with the droplet scan technique due to droplet tear-off and or smearing the droplet onto the surface.

SUMMARY OF THE INVENTION

An object of the present invention is to solve the problems which are apparent upon removing the by-products in the method of analyzing ultra-trace metals on a silicon wafer surface by using a vapor-phase etching method with a high sensitivity. These and other objects of the present invention are achieved by providing a vapor phase etching method for a semiconductor wafer, preferably a silicon wafer, allowing etching in layers of crystalline silicon for the analysis of trace metal impurities in the wafer surface layer with a high sensitivity.

BRIEF DESCRIPTION OF THE DRAWINGS

FIG. 1 shows two exemplary simplified embodiments of the etching chamber 1, in which a semiconductor wafer 2 lies on a rotatable plate 3, which can be rotated for instance by an axis 4.

FIG. 2 shows two other exemplary forms of the opening 5a of the nozzle or valve 5 for introducing the etching gas into the etching chamber 1.

DETAILED DESCRIPTION OF THE PREFERRED EMBODIMENTS

Figure 1A:
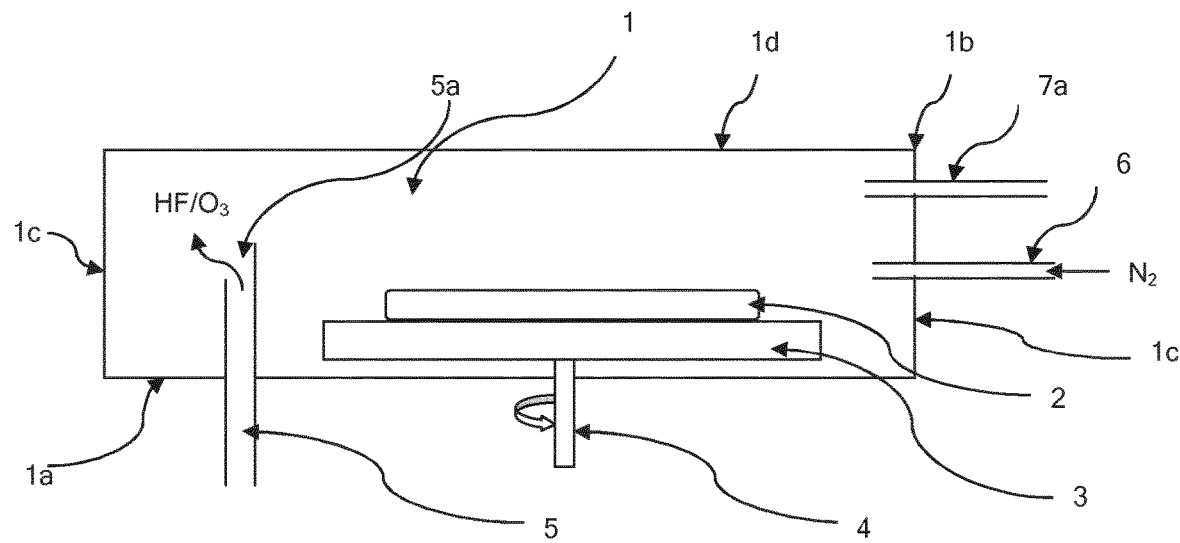
FIG. 1a shows an exemplary embodiment of the etching chamber 1 consisting of a bottom 1a and a cover 1b, whereby the cover 1b consists of at least one side wall 1c and a top 1d.

One of the major objects is to achieve reliable depth information with respect to the etched layer of the crystalline silicon. The key parameter to get reliable depth information is the uniformity of the layer etch removal. With the present invention it is possible to etch the same wafer several times, resulting in a depth profile of the respective wafer.

The object is achieved by means of a method for etching the surface layer of a semiconductor wafer 2 lying on a rotatable plate 3 in an etching chamber 1, the etching chamber consisting of a bottom 1a, above which the rotatable plate 3, is located, a cover 1b which fits to the bottom 1a, at least one opening 7 in the cover or between the lower edge of the cover 1b and the bottom 1a, respectively, and a valve or nozzle 5 located beside the rotatable plate 3 for introducing an etching gas into the etching chamber 1 through an opening 5a, wherein the opening 5a of the nozzle or valve 5 is not facing directly in the direction of the semiconductor wafer 2.

Briefly, the present invention is directed to a vapor phase etching method taking place in an etching chamber for a subsequent metal analysis step for a semiconductor wafer comprising a semiconductor wafer substrate having a front surface and a back surface, a circumferential edge, and a radius extending from the central axis to the circumferential edge of the wafer.

In more detail, the present invention relates to a process for analyzing trace metal impurities in the surface layer of a semiconductor wafer comprising a first step, i.e. step I, during which the surface layer to be analyzed is etched in an etching chamber with an etching gas to a certain extent, and drying the etched surface layer with nitrogen gas, a subsequent second step, i.e. step II, during which a standard hydrophobizing process with HF gas takes place, a third step, i.e. step III, which is a scanning step with a liquid droplet and finally a fourth step, i.e. step IV, in which the droplet obtained in step III is analyzed for trace metals.

The invention will be explained in more detail in the following.

FIG. 1 shows two exemplary simplified embodiments of the etching chamber 1, in which a semiconductor wafer 2 lies on a rotatable plate 3, which can be rotated for instance by an axis 4. The etching gas, for example a mixture of HF and $O_3$, is introduced into the etching chamber 1 through an opening (outlet) 5a of a nozzle or valve 5, which is located beside the rotatable plate 3 in such a way, that the flow of the etching gas is not directed directly to the wafer but is allowed first to distribute within the etching chamber before getting into contact with the surface of the semiconductor wafer to be etched, resulting in a very homogeneously etched surface.

The etching chamber 1 consists of a bottom 1a above which the rotatable plate 3 is located, and a cover 1b that fits to the bottom 1a. Furthermore, the etching chamber 1 has at least one opening 7, allowing the emission of for instance gaseous reaction products out of the chamber 1, whereby this at least one opening can be for instance a pipe 7a (FIG. 1a) or a gap 7b between a side wall 1c and the bottom 1a, for example forced by a plate 8 located between the bottom 1a and the lower edge of the side wall 1c (FIG. 1b).

The form of both the bottom 1a and the cover 1b is not limited to a specific format, although the inner geometry of the chamber 1 has a certain influence on the etching process due to the distribution of the etching gas introduced into the chamber 1.

For instance, the bottom 1a of chamber 1 may have a rectangular or round geometry, while the cover 1b may have a hemispherical format without any distinguishable side wall, may have a cylindrical format with one side wall 1c and a flat or hemispherical top 1d or may have a rectangular format with four side walls 1c and one flat top 1d. For the invention it is of no importance, if the cover 1b is completely removed or if only the top 1d is removed alone in order to allow the loading onto or the de-loading of the wafer 2 from the plate 3.

Figure 1B:
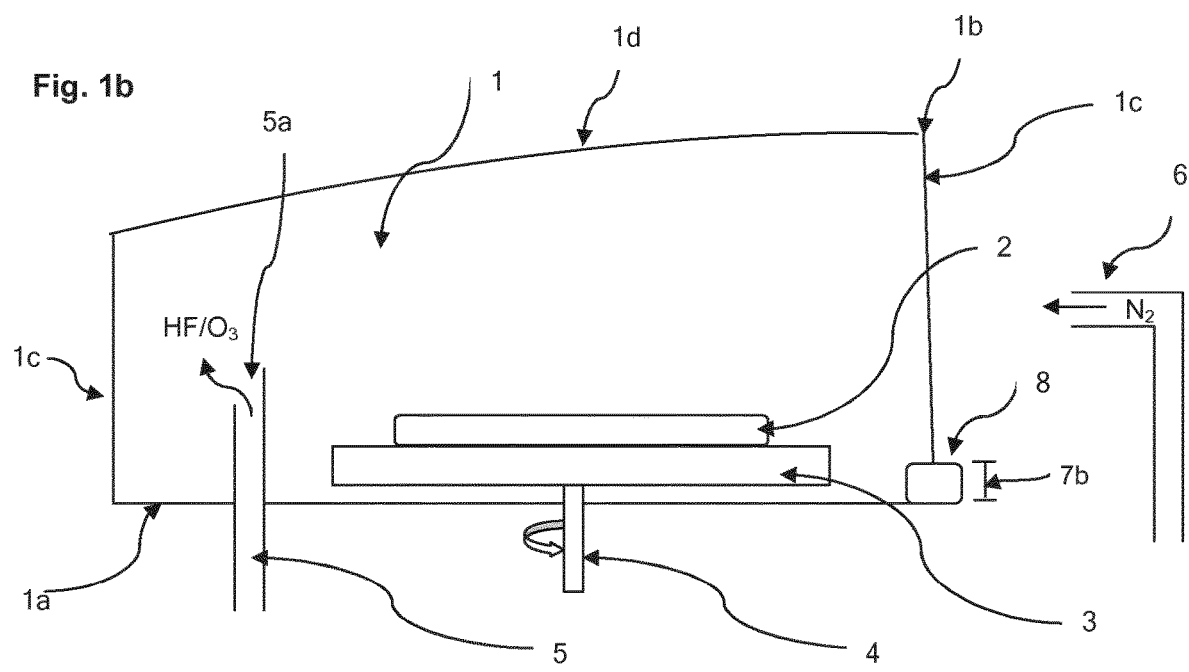
FIG. 1b shows a second embodiment of the etching chamber 1 with a convex top 1d as an example, whereby the top 1d is preferably round. In case of a round top 1d, the reaction chamber consists of only one round side wall 1c.

FIG. 1a shows an exemplary embodiment of the etching chamber 1 consisting of a bottom 1a and a cover 1b, whereby the cover 1b consists of at least one side wall 1c and a top 1d. In the embodiment exemplary shown in FIG. 1a the cover 1b has a flat top 1d. In this embodiment nitrogen gas can be introduced for drying the etched surface of the wafer 2 via a nozzle or valve 6. The gaseous reaction products formed during the etching of the front side of the wafer 2 are removed out of the etching chamber 1 via an opening 7a. The opening 7a can be a sort of pipe as shown for example in FIG. 1a or just a whole in at least one side wall. Both the nozzle or valve 6 and the opening pipe 7a, respectively, are located in this embodiment of the etching chamber 1 for example in one of the four side walls 1c (only two are shown for graphical reasons) of the chamber.

It should be pointed out, that the nozzle or valve 6 for drying the etched surface of the wafer 2 with nitrogen gas can also be located outside the etching chamber (not shown).

Furthermore, instead of the opening pipe 7a located in the sidewall 1c of the etching chamber 1, such an opening can also be realized within the bottom 1a of the etching chamber 1 or between the bottom 1a and the side wall 1c. This second embodiment of an opening can be realized for instance by one or more plates with a certain height located between the bottom and at least one of the side walls causing thereby a gap 7b allowing for instance the reaction products of the etching process to leave the etching chamber 1 or with one or more opening pipes 7a, which is/are located at the edge of the at least one side wall, whereby the edge is directed to the bottom 1a of the etching chamber 1.

FIG. 1b shows a second embodiment of the etching chamber 1 with a convex top 1d as an example, whereby the top 1d is preferably round. In case of a round top 1d, the reaction chamber consists of only one round side wall 1c. In this embodiment, the nozzle or valve 6 for drying the etched surface of the wafer 2 with nitrogen gas is for example located outside the etching chamber. Hence, for drying the etched surface of the wafer 2, the cover 1b must be removed. For an exemplary purpose, in this embodiment a gap 7b build by at least one plate 8, located at the edge of the side wall, whereby the edge is directed to the bottom 1a of the etching chamber 1, without limiting this second embodiment to this form. Regarding the location of the valve or nozzle 6 as well as the opening pipe 7a or the gap 7b the details given in the description of FIG. 1a are applicable.

If at least one plate 8 is used as shown in FIG. 1b, at least one sidewall does not fit tightly to the bottom 1. Through this gap 7b, the reaction products and or the nitrogen gas will leave the chamber 1. The height of the at least one plate determines the height of the gap 7b.

In the following, both the opening pipe 7a and the gap 7b are referred to as opening 7, because the opening 7 is not restricted to any embodiment.

Figure 2A:
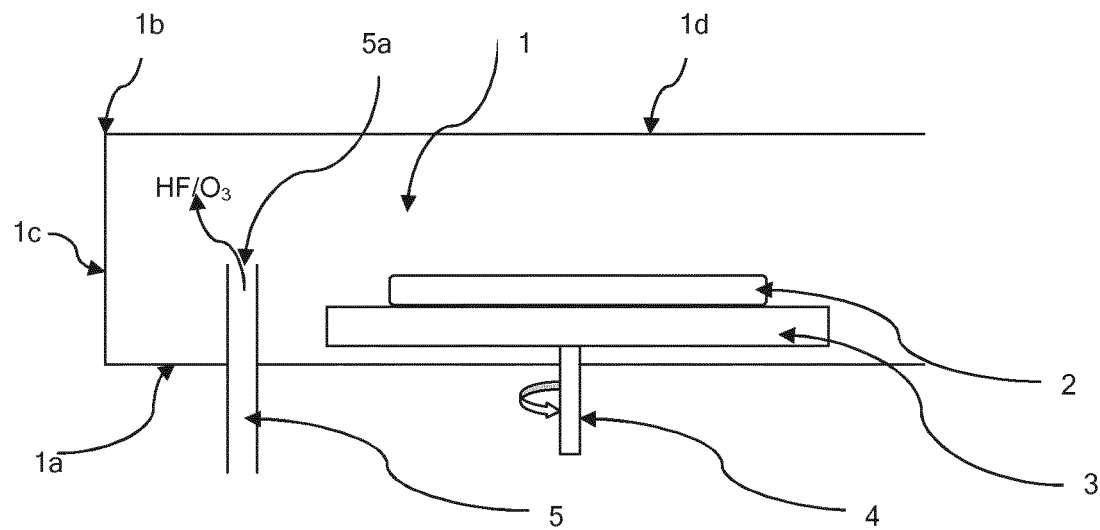
FIG. 2a shows the outlet 5a of the nozzle or valve 5 is parallel to the front side of the wafer 2 which lies on the rotatable plate 3, which can be rotated for example by an axis 4.
Figure 2B:
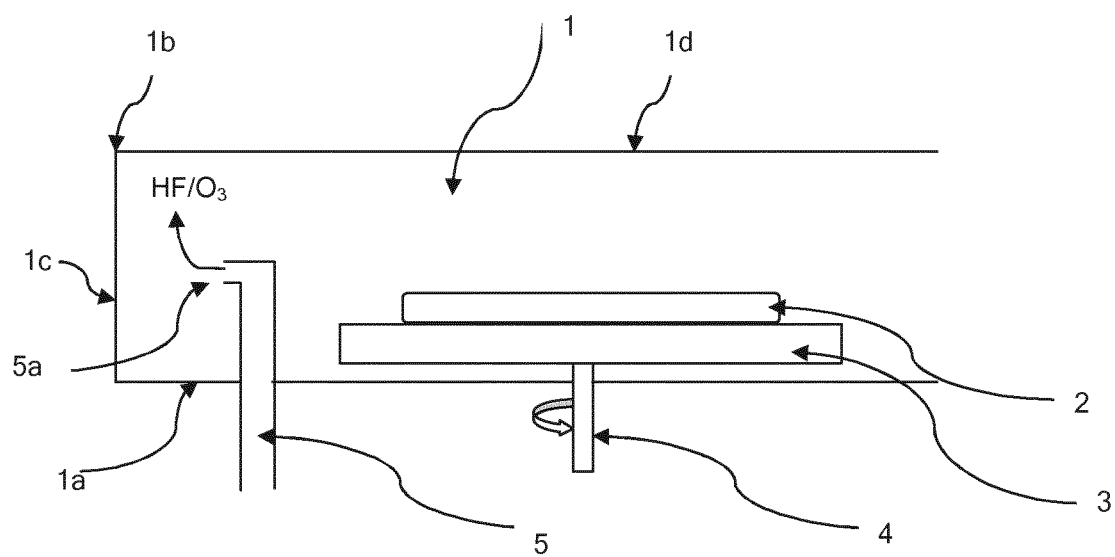
FIG. 2b shows the opening 5a of the nozzle or valve 5 is directed to a side wall of the etching chamber 1 opposite to the wafer 2 which is located on a plate 3, which can be rotated for example by an axis 4.

FIG. 2 shows two other exemplary forms of the opening 5a of the nozzle or valve 5 for introducing the etching gas into the etching chamber 1. For simplifying reasons, neither any nozzle or valve 6 for drying the etched surface of the wafer 2 with nitrogen gas nor any opening 7 is shown in FIG. 2. Furthermore, also for simplifying reasons only a part of the cover 1b with at least one side wall 1c and a top 1d is shown in FIG. 2. According to FIG. 2a, the outlet 5a of the nozzle or valve 5 is parallel to the front side of the wafer 2 which lies on the rotatable plate 3, which can be rotated for example by an axis 4. This outlet 5a allows a vertical V-shaped release of the etching gas into the etching chamber 1. According to FIG. 2b, the opening 5a of the nozzle or valve 5 is directed to a side wall of the etching chamber 1 opposite to the wafer 2 which is located on a plate 3, which can be rotated for example by an axis 4.

Figure 3:
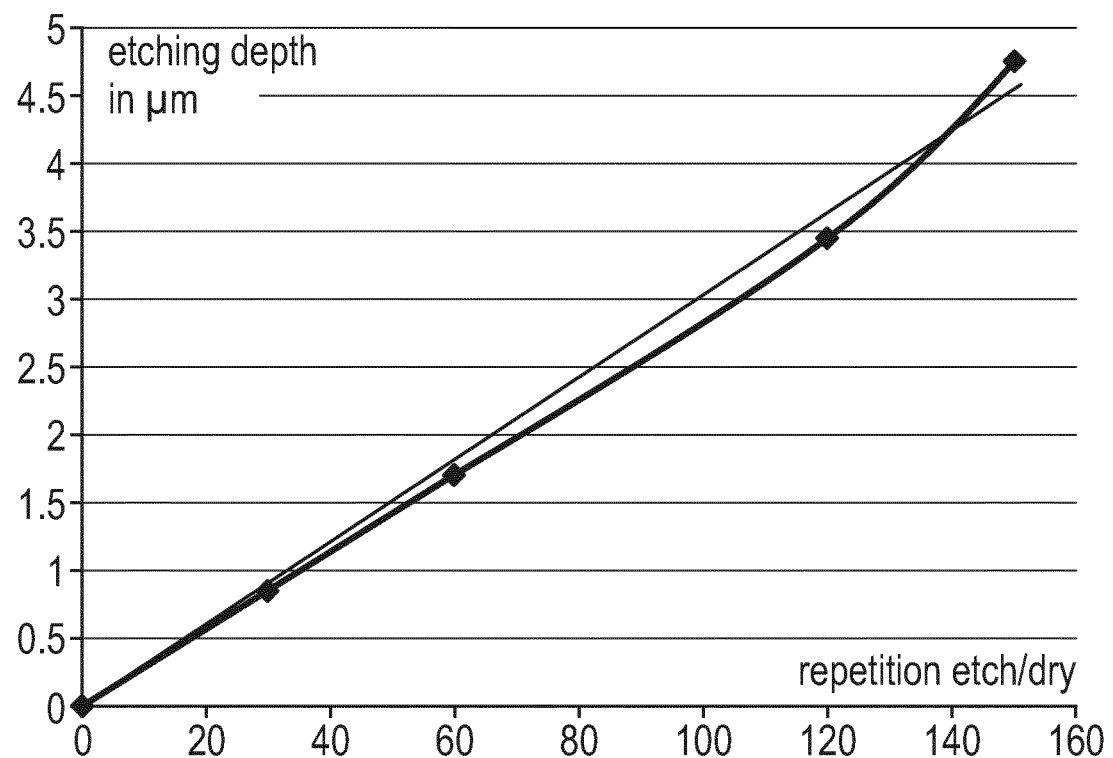
FIG. 3 shows the linear relation between the etching depth and the repetition of etching and drying steps under constant etching and drying conditions.

FIG. 3 shows the linear relation between the etching depth and the repetition of etching and drying steps under constant etching and drying conditions: HF flow 18 l/min (liter per minute), $O_3$ flow 1.5 l/min, etching time 20 seconds, drying time (with $N_2$) 40 seconds after each etching step.

The starting material for the present invention preferably is a single crystal semiconductor wafer substrate which has been sliced from a single crystal ingot grown in accordance with any of the conventional variations of the Czochralski crystal growing method (CZ) or the float-zone crystal growing method (FZ).

If a silicon wafer substrate is desired, the starting material is preferably sliced from a single silicon crystal ingot grown in accordance with any of the conventional variation of the float-zone crystal growing method. Growing a silicon ingot, as well as standard silicon slicing, lapping, etching, and polishing techniques, are well known in the art and disclosed for instance in U.S. Pat. No. 6,517,632 E2 and U.S. Pat. No. 7,033,962 B2.

The present invention is related to a method for preparing the surface layer of a semiconductor wafer for the subsequent analysis of ultra-trace metals on a semiconductor wafer surface layer, composed of the inventive step (I) of subjecting the surface of the semiconductor wafer to vapor-phase etching, a surface hydrophobization treatment step (II), a droplet scan (III), and a metal analysis step (IV). The inventive step I results in a very homogeneously etched surface layer of the semiconductor wafer 2.

The etched surface layers are not restricted to silicon oxide or nitride layers but may be mono or poly crystalline silicon layers, as well.

Regarding the present invention, the surface layer is that part of a semiconductor wafer which is the most upper layer of the surface having a thickness of up to 10 μm. It is important to note here, that the surface layer according to the present invention is not the oxide film formed on the surface of a semiconductor wafer due to the contact with atmospheric oxygen.

In order to prepare the surface layer of the front side, respectively, of the semiconductor wafer 2 for the subsequent trace metal analysis, in a first step, i.e. step I, an HF gas containing ozone is used as the etching gas. Subsequently, the etched surface is dried with nitrogen gas. In order to obtain the desired material removal from the front side of the wafer, step I may be repeated as often as necessary, whereby after each etching step the etched surface is dried with nitrogen gas.

It is of crucial importance for the present invention, that the etching gas is a mixture of HF gas and ozone, because pure HF gas will only etch the silicon oxide layer but not the silicon layer, i.e. there is a natural etching stop with pure HF gas. The ozone within the etching gas allows a controlled etching of the silicon layer to be etched, i.e. layers of the silicon surface layer can be removed stepwise by repeating the etching step as described below.

With this stepwise etching of the surface layer of the semiconductor wafer, within each etching step for instance a layer of approximately 10 to 40 nm can be removed.

Repeating the etching steps several times, whereby each etching step is followed by a metal analysis step, allows to obtain a depth profile of the metals present in the surface layer.

Because the etching depth, i.e. the thickness of the layer which is removed from the surface of the semiconductor wafer due to its contact with the etching gas during each etching step, depends on both the concentration ratio of HF and $O_3$ gas) in the etching gas and the etching time, i.e. the period of time during which the etching gas is in contact with the surface layer to be etched or removed, respectively, with the invention the total etching depth, i.e. the etching depth after a certain repetition of individual etching and subsequent drying steps, can be varied in a controlled manner between 10 nm and 5,000 nm (FIG. 3).

Hence, as an example, repeating the etching process with a constant etching depth of 100 nm 20 times with a subsequent metal analysis after each etching step, allows to obtain a metal profile of the semiconductor wafer within the first 2 μm of the surface layer.

Table 1 indicates the influence of the $HF/O_3$ content in the etching gas on the etching rate.

TABLE 1

Influence of the HF/O$_3$ content in the etching gas on the etching rate for a silicone semiconductor wafer

| HF flow, [l/min] | O$_3$ flow, [l/min] | Etching rate, [nm/min] |
|---|---|---|
| 15.0 | 1.0 | 27.2 |
| 18.0 | 1.5 | 37.1 |

If the etched surface exhibits a strong hydrophilicity, subsequent to the first step a standard hydrophobization process with HF gas, step II, follows, because a hydrophobic surface of the wafer 2 is necessary for the droplet scan step III.

The step III of the present invention is a scanning step with a liquid droplet. Preferably, the liquid is water, but can be any other liquid which can be used for a metal analysis. The liquid droplet is moved over the etched surface of the semiconductor wafer 2 thereby dissolving and collecting into said droplet metal ions. In the present invention, the method and the equipment for dissolving and collecting the contaminants on the surface by scanning the hydrophobic surface of the silicon wafer using a droplet are not particularly limited, and normal, publicly known method/equipment is preferably used.

Finally, in step IV of the present invention, the solution for analysis, which is prepared from the droplet obtained in the above step III, is analyzed by using various analysis devices. The analysis method/equipment can be selected depending on the analysis target. Specifically, normally publicly known AA, ICPMS, etc. are preferably used for analysis of metal ions.

In order to avoid the removing of the by-products in the method of analyzing ultra-trace metals on a semiconductor wafer as disclosed in JP 2011 129 831A, the inventor found that step I, i.e. the way of bringing the etching gas into contact with the surface of the semiconductor wafer 2 to be etched, is of crucial importance for the subsequent quality of the analytical results.

For the etching step I, the semiconductor wafer 2 to be etched is placed on a rotatable plate 3, whereby the side to be etched and subsequently analysed will be identified as front side in the following.

The rotatable plate 3 is located in a chamber 1, into which the etching gas can be introduced via a nozzle or a valve 5, respectively, permitting the adjustment of both the flow rate of the etching gas and the desired time for introducing the etching gas. Such an etching chamber 1 is for example described in English patent specification GB 1334796 or in the Japanese patent application JP 2001102368 A2 and shown in a schematic way in FIG. 1.

The rotatable plate 3 is located in the bottom part of chamber 1. The wafer 2 rests during the etching step I, the hydrophobization step II and the droplet scan step III, on the rotatable plate 3. The size, i.e. the diameter, of the rotatable plate 3 preferably correlates with the size of the wafer 2 to be etched, i.e. the diameter of the rotatable plate 3 is at least the same as the diameter of the wafer 2 to be etched. Close to the rotatable plate 3 there is a nozzle or a valve 5 for introducing the etching gas.

Preferably, the distance between the nozzle or valve 5 to the edge of the rotating plate 3 is in the range of 4 cm to 0.5 cm, more preferably in the range of 2 cm to 1 cm.

Preferably, the height of the opening 5a of the nozzle or valve 5 is in a horizontal line with the front side of the wafer 2 or above the wafer surface to be etched (FIG. 1 and FIG. 2). It is important for the invention, that the opening 5a of the nozzle or valve 5 is not directed towards the surface of the wafer, in order to allow the etching gas first to be distributed to a certain extent in the chamber 1. Furthermore, it is important for the invention, that the direction of the opening 5a of the nozzle or valve 5 is not directed to the opening 7. Preferably, the nozzle or valve 5 is located opposite the opening 7.

Both the inventive direction of the opening 5a of the nozzle or valve 5 and the position of the nozzle or valve 5 within the etching chamber 1 in view of the opening 7 allow a certain distribution of the etching gas within the etching chamber 1 and the reaction of the etching gas with the surface of the semiconductor wafer 2 before the etching gas can leave the etching chamber 1. Since the volume and the geometry of the chamber 1 determine the distribution of the etching gas within the chamber 1, both parameters are selected in addition for the appropriate etching result.

Furthermore, at one side within the chamber (FIG. 1a) or outside the chamber 1 (FIG. 1b), there is a nozzle or valve 6 for introducing nitrogen gas, N$_2$, into the chamber 1 or directly onto the etched surface of the wafer 2, respectively, in order to dry the etched surface.

For depositing the wafer 2 onto the rotatable plate 3 or removing the etched wafer 2 from plate 3 as well as to dry the etched surface with the nozzle or valve 6 located outside the etching chamber 1, the etching chamber 1 can be opened preferably by removing the complete cover 1b, i.e. the sidewall(s) 1c together with the top 1d. It is also preferred to open the etching chamber 1 only by removing the top 1d.

The etching of the wafer 2 lying on the rotatable plate 3 occurs when the chamber 1 is closed. Due to the opening 7 which functions as exhaust for the reaction products produced during the etching process and or when the nitrogen gas is introduced into the chamber for drying the etched surface, the closed chamber is not gastight.

As already shown in FIG. 1a and FIG. 1b, at least one opening 7 can be located in a side wall 1c of the cover 1b or be a gap 7b between the edge of at least one side wall 1c and the bottom 1a, whereby the edge of at least one side wall 1c is directed to the bottom 1a.

For the etching step I the wafer 2 is deposited on the rotatable plate 3 and the chamber 1 is closed. The etching step I starts with introducing the etching gas through the nozzle or valve 5 into the chamber 1 while rotating the wafer 2 with a certain speed.

According to the present invention, the etching gas is not brought into contact at a desired position of the surface of the semiconductor wafer 2 but introduced into the chamber 1 at room temperature in such a way, that the etching gas is distributed in the chamber 1 beside and above the front side of the wafer 2, while the wafer 2 is rotating on the plate 3 with a defined speed (FIG. 1 and FIG. 2). Hence, the etching gas comes into contact with the front side of the semiconductor wafer 2 after distributed to a certain extend in the etching chamber 1.

According to the present invention, the etching gas is introduced into the chamber 1 in that way, that the gas flow is directed in an angle of 0° with regard to the wafer surface, i.e. parallel to the wafer surface (FIG. 2b) into the direction of a chamber wall 1c, up to 90° with regard to the wafer surface, i.e. vertical to the wafer surface into the direction of the top 1d, but not directly into the direction of the wafer surface (FIG. 1 and FIG. 2).

Since the flow of the etching gas is not directed directly to the wafer surface, the front side of the semiconductor wafer 2 is etched in a very uniform way due to both the distribution of the etching gas within the chamber 1 and the rotation of the wafer 2 lying on the plate 3.

The etching rate, i.e. the amount or depth of material removed from the front side of the semiconductor wafer 2, is determined by the flow of the etching gas, the etching time, the rotation speed of the wafer 2, by the humidity of the etching gas and of course by the temperature. With the inventive etching process, the depth of the material removed from the front side of the wafer 2 can be between 10 and 5,000 nm, whereby the variation of the removal rate is less than 10%.

The type and generation method of the vapor-phase etching gas are not particularly limited. Normally publicly known etching gases or a gas mixture of these can be used as they are or diluted to an appropriate concentration. Specifically, nitric acid, hydrofluoric acid (HF), ozone ($O_3$), and nitrogen oxides ($NO_x$) can be used. Also, a gas mixture of these gases can be preferably used.

Preferably, the etching gas used in the present invention is a mixture of HF and $O_3$. For this mixture, nitrogen gas, $N_2$, is bubbled with a certain flow rate, for example 1.5 l/min, through for instance a gas washing bottle containing an HF solution, for example 200 mL of 50 wt % (weight-%) HF solution, in order to generate the HF gas, which is than mixed with the $O_3$ gas) (for instance flow rate of $O_3$ 1.5 l/min at a concentration of 150 g/m$^3$) and finally introduced into the chamber 1. The $O_3$ can be mixed with the HF gas as dry $O_3$ or wet $O_3$, whereby wet $O_3$ is dry $O_3$ gas) bubbled with a certain flow rate through for instance a gas washing bottle containing water before mixed with the HF gas. Preferably, for the etching gas dry $O_3$ is used as one component because this enhances the etching rate.

While the etching gas is introduced into the chamber 1 at room temperature the wafer 2 located on the rotatable plate 3 is rotated with a certain speed. Preferably, the rotation speed of the wafer 2 is between 5 and 15 rotations per minute (rpm), more preferably between 7 and 10 rotations per minute during the etching process.

The rotatable plate 3 can be cooled or heated, so that the wafer 2, lying on the plate 3, can be adjusted to a desired temperature via the plate 3. If the plate 3 is adjusted to a desired temperature, after depositing the wafer 2 onto the plate 3, the wafer 2 is allowed to reach the temperature of the plate before the etching step I begins. Preferably, the etching of the wafer 2 within the chamber 1 is performed at a constant temperature lying in a temperature range of 15° C. to 30° C.

Preferably, the time period for etching of the front side layer of the wafer 2 within the etching chamber 1, i.e. for introducing the etching gas into the chamber 1 while the wafer 2 is rotated, is between 3 and 60 seconds, more preferably between 5 and 30 seconds.

The etching gas reacts with the surface (front side) of the wafer 2, for instance a silicon wafer, producing mainly gaseous reaction products which are removed out of the chamber 1 via the at least one opening 7. Due to the etching, a defined layer of crystalline silicon at the surface of the wafer is at least partly removed or destroyed, respectively, allowing the subsequent droplet scan in step III after drying the etched surface with nitrogen gas and, if necessary, hydrophobizing the etched wafer surface with hydrogen fluoride gas, HF. Since step II is a standard process, it is not described further.

When the etching process is finished, the front side of the wafer is dried by blowing $N_2$ gas onto the rotating wafer 2 which still lies on the rotatable plate 3. The time period for drying the etched wafer surface is approximately the same as the time for etching the wafer surface, i.e. preferably 3 seconds to 60 seconds, more preferably between 5 and 30 seconds. Hence, the time for a single etching step I is the sum for introducing the etching gas into the chamber 1 and the time for drying the etched surface with nitrogen gas.

The etching step I, which includes the drying step, is not limited to one run but can be repeated as often as desired in order to obtain the desired removal rate.

The resulting etched front side of the semiconductor wafer 2 is comparable with a standard wafer surface after cleaning and can directly be used for VPD Method, i.e. ready for the subsequent droplet analysis step III.

The droplet-scan of the present invention is a conventional analysis technique using a droplet, preferably a water droplet containing a mixture of hydrogen peroxide, $H_2O_2$, and hydrogen fluoride, HF, which is moved over a certain area of the etched surface, thereby collecting (dissolving) the metals to be analyzed. Such a droplet scan is for example described in the SEMI Draft Document 4844: New Standard: Guide for the Measurement of Trace Metal Contamination on Silicon Wafer Surface by Inductively Coupled Plasma Mass Spectrometry, Jan. 15, 2010.

Since the location of the metals within the surface layer of the semiconductor wafer is not changed during the etching process, the present invention allows to obtain one or more depth profiles of the metal content, for instance in the center and in the edge region of the surface layer of the semiconductor wafer.

The final step IV of the present invention is a step in which the solution for analysis, which is prepared from the droplets obtained in the preceding step III, is analyzed by using various analysis devices. The analysis method/equipment can be selected depending on the analysis target. Specifically, normally publicly known AA, ICPMS, etc. can be used for analysis of metal ions.

The invention claimed is:

1. A method for etching the surface of a semiconductor wafer lying on a rotatable plate in an etching chamber for analyzing trace metal impurities on said surface, the etching chamber comprising a bottom, above which the rotatable plate, is located, a cover which fits to the bottom, and sidewalls between the bottom and cover, comprising introducing an etching gas comprising hydrogen fluoride and ozone through a valve or nozzle located beside the rotatable plate into the etching chamber, the valve or nozzle arranged such that gas flowing into the etching chamber does not flow directly in the direction of the semiconductor wafer but is directed towards the sidewall, and not in the direction of an exhaust opening, etching the surface of the silicon wafer lying on the rotatable plate in the etching chamber, wherein the etching chamber comprises at least one exhaust opening in the cover or between the lower edge of the cover and the bottom as allowing the emission of gaseous reaction products out of the chamber;

introducing an etching gas comprising a mixture of hydrogen fluoride and ozone into the etching chamber through the opening of the nozzle or valve and then drying the etched wafer surface of the silicon wafer with nitrogen gas introduced through a drying nozzle or valve, rotating the rotatable plate with the silicon wafer lying thereon during etching and drying, and scanning with a liquid droplet moved over the etched and dried surface of the silicon wafer thereby dissolving and collecting into said droplet metal ions, and analyzing the liquid droplet for trace metals.

2. The method of claim 1, wherein the time over which etching gas is introduced into the etching chamber is between 3 and 60 seconds.

3. The method of claim 1, wherein the rotatable plate can be cooled or heated.

4. The method of claim 1, wherein the rotatable plate is rotated at a rotational speed of 5 to 15 rpm during the etching process.

5. The method of claim 1,
wherein the method is repeated multiple times on the same wafer.

6. The method of claim 1, further comprising
hydrophobizing the silicon wafer with HF gas prior to scanning to make the etched and dried surface of the silicon wafer hydrophobic.

7. The method of claim 1, wherein the wafer surface is a bare wafer surface.

\* \* \* \* \*